United States Patent [19]

Lawson

[11] Patent Number: 4,507,567
[45] Date of Patent: Mar. 26, 1985

[54] VECTOR INVERSION GENERATOR

[76] Inventor: Duane C. Lawson, 8420 Pallux Way, San Diego, Calif. 92126

[21] Appl. No.: 394,111

[22] Filed: Jul. 1, 1982

[51] Int. Cl.³ ............................................... H03K 6/00
[52] U.S. Cl. ..................................... 307/106; 361/313
[58] Field of Search ................ 307/106, 110; 361/313; 333/236; 313/325; 315/36, 39

[56] References Cited

U.S. PATENT DOCUMENTS

| | | | |
|---|---|---|---|
| 2,884,605 | 4/1959 | Dubilier | 307/110 |
| 3,289,015 | 11/1966 | Fitch et al. | 307/110 |
| 3,322,976 | 5/1967 | Blank | 307/110 |
| 3,891,901 | 6/1975 | Booe et al. | 361/313 |
| 4,140,917 | 2/1979 | Weiner | 307/106 |

Primary Examiner—William H. Beha, Jr.
Attorney, Agent, or Firm—Thomas J. Tighe

[57] ABSTRACT

A conducting foil strip sandwiched between a mylar sheet and a mylar tape forms a conductor-insulator strip. An inner and an outer conductor-insulator strip are spirally wound about a tube forming an active and passive stripline pair. The inner end of a inner conductor-insulator strip is terminated by a spherical output terminal. The outer ends of the conductor-insulator strips are in electrical communication with a edge-triggered spark gap switch. The windings are encapsulated by high density urethane epoxy. The spark gap switch has a mid-plane electrode shaped like double concave cone and a pair of domed point electrodes. The margin of the conducting foil is electrically graded by staggering both the ends and the edges of the dielectrics between which the foil is sandwiched. The inner conductor-insulator strip makes one (1) complete turn around the tube before the outer conductor-insulator strip starts.

10 Claims, 7 Drawing Figures

VECTOR INVERSION GENERATOR

BACKGROUND OF THE INVENTION

This invention pertains to voltage multiplying devices which utilize the vector inversion principle and in particular to spiral generators.

A spiral generator is basically a pulse generator in which a number of electric vectors are transiently rearranged to be in series addition. The spiral generators which were first reported by Fitch and Howell (PROC. IEEE, Volume 111, No. 4, pages 849-855, 1964), are pulsed high voltage generators that provide a multiplication of the initial charging voltage. Briefly, a spiral generator is a rolled-up strip transmission line (stripline) with an additional layer of dielectric as an insulation between turns. Each of the N turns of the spiral consists both of an active and a passive stripline. The outer end of the active line is connected to a switch. The remaining ends of both lines are open. The pulsed high voltage output terminals are DC connected, with one terminal, normally the reference terminal, being connected to the outer active stripline and the other terminal being connected to the inner passive stripline. Initially, some voltage of $V_c$ is applied to the outer end of the active stripline causing both striplines to be charged to the voltage $V_c$ with the electric field vectors of the active lines oriented in one direction and the electric field vectors of the passive lines oriented in the opposite direction.

The generation of the high voltage output pulse is caused by the alignment of the active line vectors with the passive line vectors. The alignment is caused by the closing of a switch which is normally connected to the outer end of the active line. When the switch closes, a wave travels down the active line, reflects off the open circuit at the inner end, and travels back to the switch, reversing the polarity of the active line relative to it's initial charge. The voltage across each active and passive line pair is then ideally $-2V_c$. If there are N pairs of active/passive lines then the total output voltage ideally is given by the following equation:

$$V_o = -2NV_c$$

The time for the spiral generator to erect is given by the following equation:

$$\tau = 2\pi ND/v$$

where "D" is the mean diameter of the spiral and "v" is the velocity of light in the dielectric.

After the wave reaches the switch again, it reflects off the short circuit of the closed switch with the opposite sign and begins to travel back down the active line. As it proceeds it de-erects the generator, which returns to zero output after a total elapse time of $2\tau$. After this voltage continues to oscillate up and down with a period equal to $2\tau$.

In high voltage applications, spiral generators presented heretofore have a set of problems which are addressed and corrected by the invention presented herein. First of all, there is significant mechanical stress due to the electric field between the striplines when the unit is charged to its initial value, typically in the thousands of volts range. Secondly, there are two flash-over problems, the flash-over which occurs around the edge of the dielectric strips and the flash-over caused by corona from the edges of the conducting tape. Furthermore, there is a punch-through problem connected with the innermost conducting layer where it passes over the end of the dielectric tape. The punch-through of course breaks down the insulation properties of the dielectric and provides a path for electrical conduction and therefore reduction of the output voltage of the generator. In addition to the above, the switch which starts the process of high voltage pulse generation has a certain amount of inductance. The inductance, of course, has a significant effect upon the rise time of the switch. The rise time of the current through the switch has a direct effect upon the output voltage of a generator.

The invention presented herein significantly reduces or eliminates the above described problems. Other advantages and attributes of this invention will be apparent upon reading of the text hereinafter.

SUMMARY

It is an object of this invention to eliminate or significantly reduce the problems discussed hereinabove. Other objects of this invention will be readily apparent upon a reading of the text herein.

This invention presents a conducting foil strip sandwiched between a mylar sheet and a mylar tape to form a conductor-insulator strip. An inner and an outer conductor-insulator strip are spirally wound about a hollow acrylic tube for 2N turns thereby forming N turns of an active and passive stripline pair. The inner end of the inner conductor-insulator strip is terminated by a spherical high voltage output terminal which is disposed within the tube. The outer ends of the conductor-insulator strips are connected to an edge-triggered spark gap switch. The conductor-insulator windings are encapsulated by high density urethane epoxy. The spark gap switch has a mid-plane electrode shaped like a double concave cone and a pair of dome point electrodes.

The generation of the high voltage pulse is caused by applying an initial charging voltage across the terminals of the switch and thereby charging the inner and outer conductor-insulator strips, with the electric fields of the active and passive striplines being oppositely oriented. The edge-triggered switch is activated by a rapid change in the charging voltage which is applied to the terminals of the switch.

DESCRIPTION OF THE PREFERRED EMBODIMENT

Figure 1:
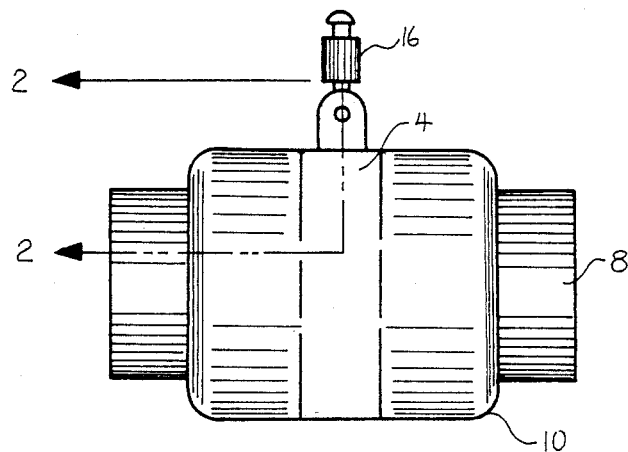
FIG. 1 is a pictorial side view of the invention.
Figure 2:
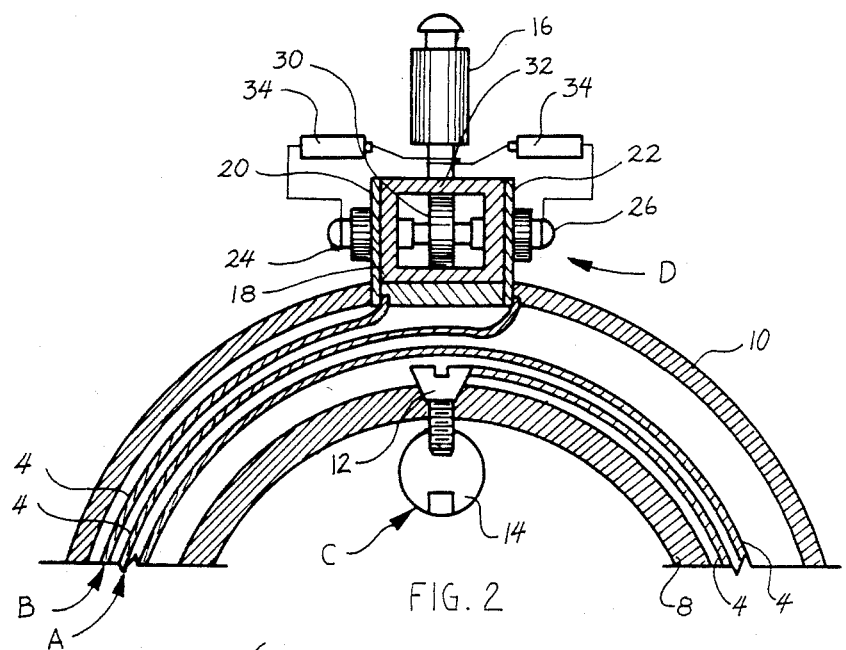
FIG. 2 is a diagrammatical partial section taken along line 2—2 of FIG. 1.

Referring to the figures, a core tube 8, preferably acrylic, is shown to have spirally wound about it an inner and an outer conductor-insulator strip, generally designated respectively "A" and "B". Both strips "A" and "B" are constructed identically and each comprises a conducting foil or tape 4 sandwiched between a first dielectric 2 and a second dielectric 6. The wound strips "A" and "B" are encapsulated by an encapsulation material 10, preferably high density urethane epoxy. A high voltage (HV) output, generally designated "C" is shown disposed within the hollow tube 8. The output terminal "C" comprises a screw means extending through the wall of the tube 8 with the head of the screw mating with the outer wall of the tube. A spherical electrode means 14 is screwed onto the screw means 12. A switch means, generally designated "D", is shown fixed to the rim of the encapsulation material 10. The switch "D" comprises a DC blocking capacitor 16, a cylindrically shaped acrylic casing 18, a first electrically conductive end plate 20, a second electrically conductive end plate 22, a first dome-point electrode 24, a second dome-point electrode 26, a mid-plane electrode 30, and a pair of resistors, preferably carbon, 34.

Figure 3:
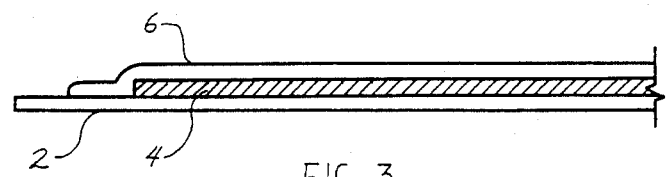
FIG. 3 is a section taken along line 3—3 of FIG. 4.
Figure 4:
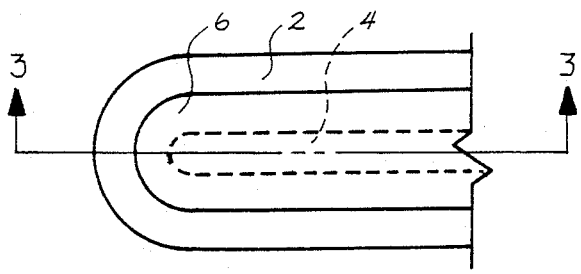
FIG. 4 is a plan view of an end of a conductor-insulator strip.

Referring to FIGS. 3 and 4, the construction of the conductor-insulator strips is shown. The first dielectric 2 is preferably a mylar sheet, and the second dielectric 6 is preferably mylar tape with an adhesive backing. The adhesive backing fixes the position of the conducting foil 4 with respect to the two dielectrics. The advantages of the adhesive-backed mylar tape are fourfold. First, it seals the edges of the conductor strip in insulation while it causes the stair-step grading of the conductor-insulator strip margins. Second, it assures that the conductor strip does not move on the main mylar insulating strip when the device vibrates, especially when the device is erecting or de-erecting a pulse. Third, it provides extra dielectric strength to prevent punch-through. Fourth, it prevents movement of the three component strips of a conductor-insulator strip with respect to each other while the device is being manufactured.

The novel and unique construction of the conductor-insulator strips of this invention significantly reduces or although eliminates the problem of flash-over and punch-through which occurs at the end of the strips and along the edges of the strips in conventional generators. The above described events usually occur when the electric field intensity is sufficiently high to either ionize the air, thus providing a low impedance conducting path, or to breakdown the dielectric so that it too becomes a conducting path. It is well known that electric field intensity is inversely proportional to the surface are over which the field is distributed. For this reason, the electric field intensity, for a given charge, tends to be much higher along edges and in corners of conducting material. As can be seen, the ends of the conductor-insulator strips are rounded into a radius for the purpose of eliminating corners.

The sharp edges of the conducting foil are essentially eliminated by the grading technique used in the construction of the conductor-insulator strips. The grading is accomplished by having each strip achieve its maximum thickness in stair step fashion. As can be seen in FIG. 4, the first dielectric is longer and wider than the second dielectric which in turn is longer and wider than the conducting foil. Thus, when the foil is sandwiched between the two dielectrics, the margins of the three strips are staggered. In FIG. 3 it can be seen that this staggering causes the composite margin of the conductor-insulator strip to be effectively graded.

Figure 5:
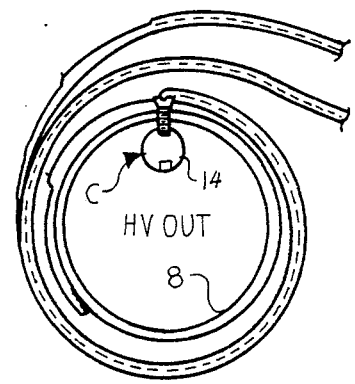
FIG. 5 is a diagrammatical representation of how the invention is initially wound.
Figure 6:
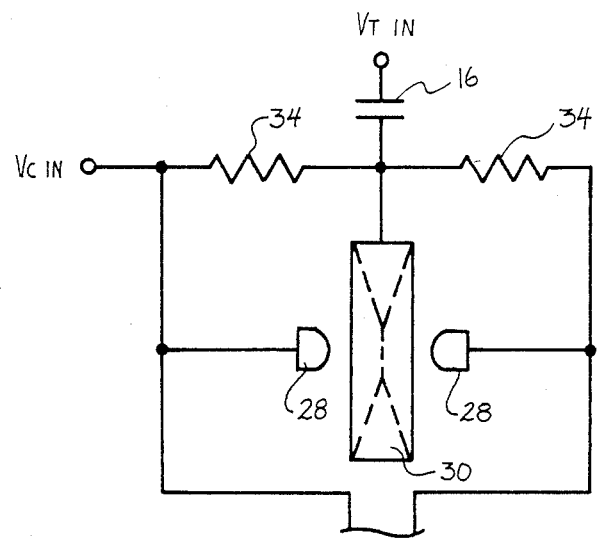
FIG. 6 is a schematical representation of the switch.

Referring to FIG. 5, one can see that the inner conductor-insulator strip makes one complete turn around the tube before the outer conductor-insulator strip starts. However, the inner ends of the two strips are aligned in the same radial plane for timing purposes. As can be seen, this is a departure from the prior art which normally has the two strips start adjacent to each other. The effect of the extra turn is that the starting end of the outer strip is adjacent to a conducting plane rather than the starting edge of the inner strip. This configuration relieves much of the electrical stress which occurs at the end points of both strips during the operation of the generator. In conventional spiral generators, considerable stress occurs when the wave reaches the end points of the strips. The high impedance of the open ends and the presence of the wave cause the charge build up to be maximum thereby creating an intense electric field between the ends of the strips, which often causes a breakdown in the dielectric between the strips and punch-through occurs. In this invention, the ends of the strips are not adjacent but in fact separated by a conducting plane which significantly reduces the electric field intensity between the two ends.

With respect to the construction of the conductor-insulator strips, it has been found empirically that the preferred overlap between the first dielectric and the second dielectric is six (6) inches and that the preferred overlap between the second dielectric and the conducting foil is also six (6) inches. It has also been found that the overlap should increase or decrease by two (2) inches per fifty thousand (50,000) volt range of the generator. That appears to be the rule of thumb for flash-over on the surface of mylar.

The switching means "D" is an edge-triggered spark gap switch operated in the over-voltage mode. The trigger initiating switching action is a ten thousand (10,000) volt peak double exponential waveform pulse $V_t$. The switch is preferably set to self-fire at twelve thousand volts to insure that no more than twelve thousand (12,000) volts is placed across the input of the generator. The DC isolation capacitor is preferably five hundred (500) micro-microfarads. Equalization of the voltage across the switch is accomplished by the two (2) resistors 34 which are preferably ten (10) megohms, two (2) watt carbon resistor. The mid-plane electrode is connected to the output of the capacitor and has the effect of significantly reducing the effective inductance of the switching means, that is, a very fast closure of the switch. The use of the mid-plane electrode has been found to reduce the effective inductance of the switching to twenty-five (25) nanohenrys or less.

The dome-point electrode are so named because at their spark point they are domed in the form of a hemisphere 28. The distance between the domed points of the electrodes has a direct bearing on the voltage at which the switch fires. The electrodes themselves are threaded and, therefore, the distance or gap between the domed points can be adjusted by screwing the electrodes either in or out.

The mid-plane electrode is in the form of a center-holded disc with its end surfaces beveled inward forming concave cones. The beveling creates an annular tapered portion of the planar electrode having substantially a "V" shaped cross section with the apex of the "V" defining the centered hole. With a dome radius of ⅜ inches, it has been found that the mid-plane electrode preferably has an inner diameter of 1¼ inches, with a 15° inward beveling for both end surfaces. Emperically it has been found that these preferable dimensions and those proportional thereto cause an electric field between a domed, or hemispherical, electrode and the planar electrode to be substantially normal to both the hemispherical electrode and a facing surface of the tapered portion.

Figure 7:
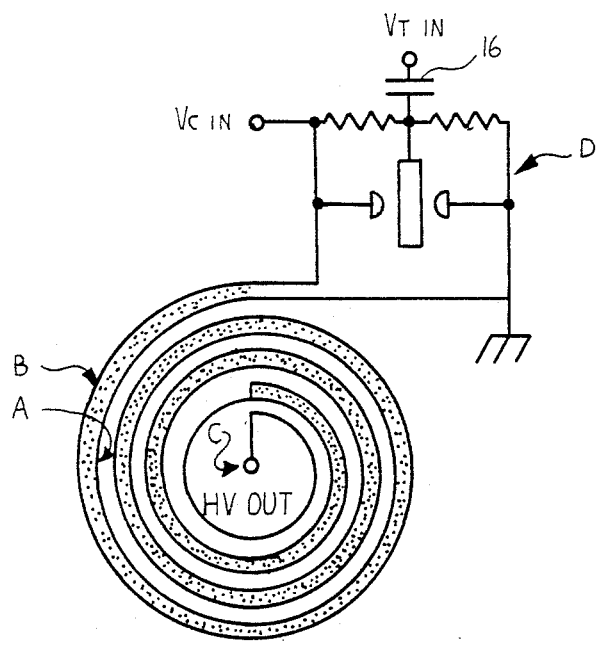
FIG. 7 is a schematical representation of the invention.

Referring to FIG. 7, a schematical representation of the spiral generator of this invention is shown. The shaded gap between the inner and outer conductor-insulator strips represents the active stripline formed by the two (2) strips, and the unshaded gap represents the passive stripline. As explained before, when the generator is initially charged to a voltage Vc, the electric field vectors of the passive stripline are oppositely oriented to those of the active stripline, but when the switch is closed, a wave travels down the active line, reflects off the open circuit at the other end and travels back to the switch reversing the vectors of the active line relative to its initial charge. With all the vectors in alignment, the charging voltage has effectively been multiplied by the number of turns and the resultant high voltage pulse can be seen at the high voltage terminal "C". Because of circuit loss, the theoretical HV output is actually reduced by 25% so that the voltage out of the generator more closely approximates:

$$V_o = -2NV_c(0.75)$$

The encapsulation of the generator in high density urethane epoxy minimizes the corona effect which has been a problem with prior existing spiral generators.

The foregoing detailed description was given for illustrative purposes only and no unnecessary limitations should be construed therefrom because variations in materials, dimensions, and other aspects of this invention can be made without departing from the substance and scope of this invention.

I claim:
1. A voltage multiplying device comprising:
 (a) a tube means,
 (b) a stripline means comprising an inner and an outer conductor strip aligned in parallel and separated by a dielectric material, the stripline means being wound about the tube means in such a fashion that the inner conductor makes one complete turn around the tube before the outer conductor starts,
 (c) a voltage output terminal means in electrical communication with and disposed at one end of the stripline means, and
 (d) a switching means in electrical communication with and disposed at the end of the stripline remote from the voltage output terminal means, the switching means being operable to present a suitably high impedance and a suitably low impedance across the stripline means when the switching means is open and closed, respectively.

2. The device of claim 1 wherein the stripline means comprises an inner and an outer conductor-insulator strip aligned in parallel, each conductor-insulator strip comprising a conducting strip sandwiched between a first and a second dielectric strip.

3. The device of claim 2 wherein the margins of each conductor-insulator strip are graded stair-step fashion by means of staggering the margins of the dielectric and conducting strips with respect to each other in order to reduce electric field intensity at the stripline margins.

4. The device of claim 2 or 3 wherein the first dielectric strip is longer and wider than the second dielectric strip which, in turn, is longer and wider than the conducting strip.

5. The device of claim 3 wherein the margins of the first dielectric strip overlap the margins of the second dielectric strip by substantially 6 inches, and wherein the margins of the second dielectric strip overlap the margins of the conducting strip by substantially 6 inches plus or minus 2 inches for each increase or decrease, respectively, of 50,000 volts in a range of the device.

6. The device of claim 3 wherein a face of the second dielectric strip which abuts the conducting strip and the first dielectric strip is adhesive in order to inhibit movement and separation of the strips with respect to each other.

7. The device of claim 2 or 3 wherein all corners of the conducting and both dielectric strips are suitably rounded to reduce electric field intensity at said corners.

8. The device of claim 2 or 3 further comprising an encapsulation means for encapsulating the stripline means and the dielectric means.

9. The device of claim 2 or 3 wherein the switching means is a spark gap switch utilizing a mid-plane electrode.

10. The device of claim 9 wherein the spark gap switch comprises:
 (a) a pair of hemispherical electrodes adjustably and oppositely spaced apart,
 (b) a generally planar electrode disposed midway between the hemispherical electrodes in a plane normal to an imaginary line drawn between the hemispherical electrodes and normal to each,
 (c) a circular orifice defined by the planar electrode and coaxial with the line,
 (d) an annular tapered portion of the planar electrode having substantially a "V" shaped cross section with the apex of the "V" defining the orifice,
 (e) means for applying a suitably high electrical potential between the hemispherical electrodes,
 (f) means for dividing the electrical potential and applying substantially half of the electrical potential to the planar electrode, and
 (g) means for applying a high voltage triggering pulse to the planar electrode.

* * * * *